(12) United States Patent
Shimoida et al.

(10) Patent No.: US 8,441,036 B2
(45) Date of Patent: May 14, 2013

(54) SEMICONDUCTOR DEVICE AND METHOD OF MANUFACTURING THE SAME

(75) Inventors: Yoshio Shimoida, Yokosuka (JP);
Tetsuya Hayashi, Yokosuka (JP);
Hideaki Tanaka, Yokohama (JP);
Shigeharu Yamagami, Yokohama (JP);
Masakatsu Hoshi, Yokohama (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 1192 days.

(21) Appl. No.: 11/724,389

(22) Filed: Mar. 15, 2007

(65) Prior Publication Data

US 2007/0221955 A1    Sep. 27, 2007

(30) Foreign Application Priority Data

Mar. 22, 2006   (JP) ................. 2006-079107

(51) Int. Cl.
*H01L 29/739*    (2006.01)

(52) U.S. Cl.
USPC ............ 257/194; 257/E21.066; 257/E29.081; 257/E29.104

(58) Field of Classification Search ................. 257/194, 257/E21.066, E29.081, E29.104
See application file for complete search history.

(56) References Cited

U.S. PATENT DOCUMENTS

| 4,992,390 A | 2/1991 | Chang |
| 6,194,741 B1 | 2/2001 | Kinzer et al. |

FOREIGN PATENT DOCUMENTS

| EP | 1 519 419 A2 | 3/2005 |
| EP | 1519419 A2 * | 3/2005 |
| JP | 2003-318396 | 11/2003 |
| JP | 2005-260172 A | 9/2005 |

* cited by examiner

*Primary Examiner* — Long Pham
(74) *Attorney, Agent, or Firm* — Young Basile

(57) ABSTRACT

A trench is formed extending from a surface of a hetero semiconductor region of a polycrystal silicon to the drain region. Further, a driving point of the field effect transistor, where a gate insulating film, the hetero semiconductor region and the drain region are adjoined, is formed at a position spaced apart from a side wall of the trench.

7 Claims, 11 Drawing Sheets

SEMICONDUCTOR DEVICE AND METHOD OF MANUFACTURING THE SAME

CROSS-REFERENCE TO RELATED APPLICATION

This application claims priority from Japanese Patent Application Serial No. 2006-079107, filed Mar. 22, 2006, which is incorporated herein in its entirety by reference.

TECHNICAL FIELD

The present invention relates to a semiconductor device having a field effect transistor with a heterojunction and a method of manufacturing the same.

BACKGROUND

Japanese Laid-Open Patent Publication No. 2003-318398 discloses an exemplary method of manufacturing a field effect transistor. In that transistor, an N$^-$-type polycrystal silicon region is formed and adjoined to a main surface of a semiconductor substrate, wherein an epitaxial region of an N$^-$ type silicon carbide is formed on an N$^+$-type silicon carbide substrate. The epitaxial region and the N$^-$-type polycrystal silicon region collectively form a heterojunction. Further, a gate electrode is formed adjacent to a junction portion of the epitaxial region and the N$^-$-type polycrystal silicon region using a gate insulating film.

The N$^-$-type polycrystal silicon region is connected to a source electrode. Further, a drain electrode is formed at an underside of the N$^+$-type silicon carbide substrate.

Such a semiconductor device functions as a switch of a field effect transistor by controlling an electrical potential of the gate electrode when the source electrode is grounded to apply a predetermined positive electrical potential to the drain electrode. That is, when the gate electrode is grounded, a reverse bias is applied to the heterojunction of the N$^-$-type polycrystal silicon region and the epitaxial region such that the current does not flow between the drain and source electrodes. However, when a predetermined positive voltage is applied to the gate electrode, a gate electrical field affects the heterojunction interface of the N$^-$-type polycrystal silicon region and the epitaxial region. Further, the thickness of an energy barrier formed by the heterojunction surface of the gate oxide film interface becomes thinner. As such, the current flows between the drain electrode and the source electrode.

In addition, the above semiconductor device uses the heterojunction portion as a control channel for blocking and conducting the current. Also, the length of the channel depends on the thickness of a hetero barrier, thereby obtaining a low resistance conduction characteristic. As such, a lower resistance conduction can be obtained as the intensity of the gate electrical field becomes greater in the heterojunction interface of the N$^-$-type polycrystal silicon region and the epitaxial region where the gate electrode is adjoined using the gate insulating film.

BRIEF SUMMARY OF THE INVENTION

Embodiments of a semiconductor device are taught herein. One example comprises a semiconductor substrate of a first conductive-type, the semiconductor substrate having a trench formed therein, and a heterojunction forming portion adjoined to a main surface of the semiconductor substrate and forming a heterojunction with the semiconductor substrate. A gate electrode is disposed adjacent to a junction end of the heterojunction forming portion and the semiconductor substrate using a gate insulating film, a source electrode is connected to the heterojunction forming portion, and a drain electrode is connected to the semiconductor substrate. A driving point of the semiconductor substrate where the gate insulating film, the hetero semiconductor region and the semiconductor substrate are adjoined is at a position spaced apart from a side wall of the trench.

Various methods of manufacturing the semiconductor devices taught herein are also disclosed.

One method comprises, by example, depositing a hetero semiconductor region on a semiconductor substrate of a first conductive-type, wherein the hetero semiconductor region forms a heterojunction with the semiconductor substrate, forming a trench by selectively removing portions of the semiconductor substrate and the hetero semiconductor region by a dry etching, forming a sacrificial oxide film by thermally oxidizing the semiconductor substrate and the hetero semiconductor region forming at least a side wall of the trench, removing the sacrificial oxide film, forming a gate insulating film on an exposed surface of the semiconductor substrate and the hetero semiconductor region including an inner surface of the trench after removing the sacrificial oxide film, forming a gate electrode adjacent to a junction end of the semiconductor substrate and the hetero semiconductor region using the gate insulating film, forming a source electrode connected to the hetero semiconductor region and forming a drain electrode connected to the semiconductor substrate. A device driving point where the gate insulating film, the hetero semiconductor region and the semiconductor substrate are adjoined is at a position spaced apart from a side wall of the trench.

According to another method taught herein, manufacturing includes depositing a hetero semiconductor region on a semiconductor substrate of a first conductive-type, wherein the hetero semiconductor region forms a heterojunction with the semiconductor substrate, and forming a trench by selectively removing the semiconductor substrate and the hetero semiconductor region by a dry etching. Then, the method includes selectively etching the semiconductor substrate and the hetero semiconductor region by a wet etching, wherein the wet etching has different selecting ratios for the semiconductor substrate and the hetero semiconductor region. The method further includes forming a gate insulating film in the semiconductor substrate and the hetero semiconductor region including an inner surface of the trench after selectively etching the semiconductor substrate and the hetero semiconductor region by the wet etching, forming a gate electrode adjacent to a junction end of the semiconductor substrate and the hetero semiconductor region using the gate insulating film, forming a source electrode connected to the hetero semiconductor region and forming a drain electrode connected to the semiconductor substrate. A driving point of the semiconductor device where the gate insulating film, the hetero semiconductor region and the semiconductor substrate are adjoined is at a position spaced apart from a side wall of the trench.

An alternate method described herein comprises depositing a hetero semiconductor region on a first conductive-type semiconductor substrate, wherein the hetero semiconductor region forms a heterojunction with the semiconductor substrate, forming a trench by selectively removing the hetero semiconductor region by a dry etching, wherein a bottom surface of the trench is a junction interface of the semiconductor substrate and the hetero semiconductor region, forming a sacrificial oxide film by thermally oxidizing the semiconductor substrate and the hetero semiconductor region forming at least an inner portion of the trench, removing the sacrificial oxide film, forming a gate insulating film on the semiconductor substrate and the hetero semiconductor region including the inner surface of the trench after removing the sacrificial oxide film, forming a gate electrode adjacent to a junction end of the semiconductor substrate and the hetero semiconductor region using the gate insulating film, forming a source electrode connected to the hetero semiconductor region and forming a drain electrode connected to the semiconductor substrate. A driving point of the semiconductor device where the gate insulating film, the hetero semiconductor region and the semiconductor substrate are adjoined is formed at a position spaced apart from a side wall of the trench before forming the sacrificial oxide film.

Another method of manufacturing a semiconductor device taught herein comprises depositing a hetero semiconductor region on a first conductive-type semiconductor substrate, wherein the hetero semiconductor region forms a heterojunction with the semiconductor substrate, and forming a trench wherein a bottom portion of the trench extends to the semiconductor substrate and a thickness of a portion of the hetero semiconductor region around the trench is smaller than a thickness of other portions of the hetero semiconductor region, wherein forming the trench includes selectively removing the semiconductor substrate and the hetero semiconductor region by an isotropic etching. The method further includes forming a sacrificial oxide film by thermally oxidizing at least the hetero semiconductor region after forming the trench, selectively removing the portion of the hetero semiconductor region around the trench smaller that the thickness of the other portions by removing the sacrificial oxide film, forming the gate insulating film on the semiconductor substrate and the hetero semiconductor region including an inner surface of the trench after removing the sacrificial oxide film, forming a gate electrode adjacent to a junction end of the semiconductor substrate and the hetero semiconductor region using the gate insulating film, forming a source electrode connected to the hetero semiconductor region and forming a drain electrode connected to the semiconductor substrate. A driving point of the semiconductor device where the gate insulating film, the hetero semiconductor region and the semiconductor substrate are adjoined is at a position spaced apart from a side wall of the trench.

BRIEF DESCRIPTION OF THE DRAWINGS

The description herein makes reference to the accompanying drawings wherein like reference numerals refer to like parts throughout the several views, and wherein.

DETAILED DESCRIPTION OF EMBODIMENTS OF THE INVENTION

In the above semiconductor device, the hetero semiconductor region is etched by using a dry etching method and the like. Further, the gate insulating film is formed at a side surface thereof to form a driving point where the hetero semiconductor region, the semiconductor substrate and the gate insulating film are adjoined. However, damage caused by etching remains on the driving point to thereby hinder the driving power of the transistor. This makes it very difficult to reduce impedance in a switching element of the transistor.

Embodiments of the invention, however, provide a semiconductor device having a heterojunction and being adapted to reduce impedance, as well as a method of manufacturing the same. To do this, embodiments of the invention provide a semiconductor device that include, for example, a first conductive-type semiconductor substrate, a hetero semiconductor region adjoined to a main surface of the semiconductor substrate to form a heterojunction with the semiconductor substrate, a gate electrode disposed adjacent to a junction end of the hetero semiconductor region and the semiconductor substrate using a gate insulating film, a source electrode connected to the hetero semiconductor region and a drain electrode connected to the semiconductor substrate. In these semiconductor devices, a trench is formed within the semiconductor substrate. Further, a driving point of the semiconductor device (where the gate insulating film, the hetero semiconductor region and the semiconductor substrate are adjoined) is formed and located apart from a side wall of the trench.

According embodiments described herein, the driving point of the semiconductor device is formed at a region unaffected by the etching damage caused when forming the trench. Therefore, the driving power of the semiconductor device can be improved to thereby reduce impedance.

Hereinafter, various embodiments of the invention are described with reference to the accompanying drawings.

Figure 1:
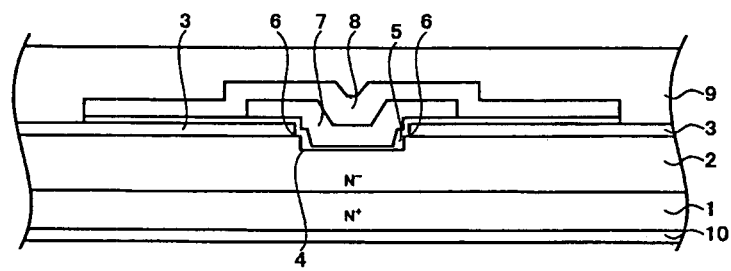
FIG. 1 is a cross-sectional view of a semiconductor device constructed in accordance with a first embodiment of the invention.

FIG. 1 is a cross-sectional view of a field effect transistor of a semiconductor device constructed in accordance with a first embodiment of the invention. In this transistor, two unit cells of the transistor are disposed in parallel and face each other. Although a plurality of unit cells may be connected in parallel to form a transistor, the above cross-sectional structure is explained below as a representative transistor.

In FIG. 1, an N-type low concentrated (N$^-$) drain region 2 containing SiC is formed on a main surface of an N-type high concentrated (N$^+$) substrate region 1 containing SiC. The drain region 2 is formed by an epitaxial layer grown on the substrate region 1. The drain region 2 forms a semiconductor substrate together with the substrate region 1.

Although there are several poly types (polycrystal) of SiC, this embodiment is explained with 4H—SiC as an example. It should be understood that the thicknesses of the substrate region 1 and the drain region 2 may not be drawn to scale in FIG. 1. In one embodiment, the substrate region 1 has a thickness of several hundreds of μm, whereas the drain region 2 has a thickness ranging from several μm to several tens of μm.

An $N^+$-type hetero semiconductor region 3 containing a polycrystal silicon is formed on a main surface of the drain region 2. The polycrystal silicon differs from SiC in terms of band gap and electron affinity. Therefore, a heterojunction is formed at both junction interfaces (for which the polycrystal silicon is used as a material for a hetero semiconductor region).

A gate electrode 7 is formed adjacent to the junction portion of the drain region 2 and the hetero semiconductor region 3 using the gate insulating film 5. The hetero semiconductor region 3 is directly connected to a source electrode 9. A drain electrode 10 is electrically and ohmically connected to an underside of the substrate region 1 at a low resistance. The gate electrode 7 is insulated from the source electrode 9 by using an interlayer insulating film 8.

A trench, which extends from a surface of the hetero semiconductor region 3 to the drain region 2, is formed. Further, the gate insulating film 5 and the gate electrode 7 are formed within the trench. Although the trench is formed in an inner portion of the drain region 2 as shown in FIG. 1, the trench may be alternatively formed to extend to the junction interface of the hetero semiconductor region 3 and the drain region 2. In this first embodiment, the driving point 6 (where the hetero semiconductor region 3, the drain region 2 and the gate insulating film 5 are adjoined) is formed and located apart from the side wall of the trench. As used herein, a driving point refers to a location where the current flows from a source to a drain when a predetermined electric field is applied from a gate electrode. In one example herein, the source is a polysilicon region, and the drain is a SiC epilayer.

A method of manufacturing the device shown in FIG. 1 is now explained with reference to FIGS. 2a to 2k.

Figure 2A:
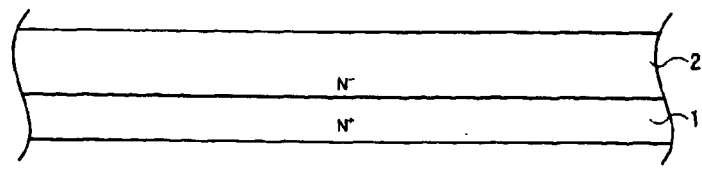
FIGS. 2a to 2k are cross-sectional views for illustrating a method of manufacturing a semiconductor device constructed in accordance with the first embodiment.

First, as shown in FIG. 2a, the drain region 2 containing an $N^-$-type SiC is formed on the $N^+$-type substrate region 1 by an epitaxial growth, etc.

Figure 2B:
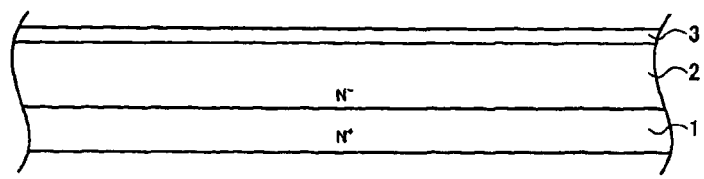

Thereafter, a polycrystal silicon is deposited on the drain region 2. A heterojunction is then formed between the drain region 2 and the hetero semiconductor region 3. In such a configuration, a post-annealing may be performed in order to obtain a desired heterojunction characteristic by controlling the particle size or the grain boundary condition of the polycrystal silicon. Subsequently, impurities are introduced into the hetero semiconductor region 3 (which contains a hetero silicon) by, for example, using a mechanism such as ion injection. This is so that the hetero semiconductor region 3 can become an $N^+$-type. Examples of the impurities include As (arsenic), P (phosphorous) and the like. This configuration is shown in FIG. 2b.

Figure 2C:
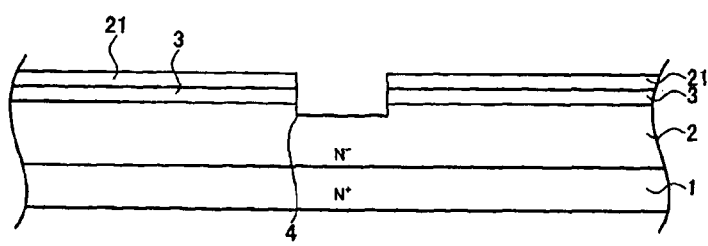

Next, a resist pattern 21 corresponding to a mask material is formed on the hetero semiconductor region 3 as shown in FIG. 2c. The hetero semiconductor region 3 and the drain region 2 are selectively removed by dry etching using the resist pattern as a mask. The trench is formed such that a bottom portion 4 of the trench reaches an inner portion of the drain region 2. Alternatively, the mask material may be an oxide film. The etching may be performed with good controllability through a dry etching method, which uses ion or plasma to obtain a fine pattern.

Figure 2D:
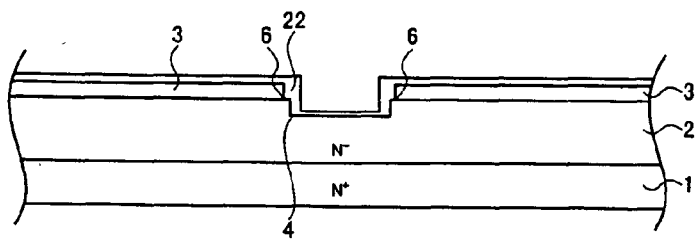

Subsequently, after the mask material is removed, a sacrificial oxide film 22 is formed by thermally oxidizing an exposed portion of the polycrystal silicon, i.e., the hetero semiconductor region 3. In such a case, a surface of the drain region 2 containing SiC is also oxidized. However, since an oxidation ratio of SiC is smaller than that of the polycrystal silicon, the amount of the drain region 2 (containing SiC) being oxidized becomes smaller than that of the hetero semiconductor region 3 containing polycrystal silicon. This is shown in FIG. 2d.

Then, the sacrificial oxide films 22 formed in the above process are removed using a fluoric acid based wet etching. As such, the trench-side end of the polycrystal silicon is receded from the side wall of the trench (shown in FIG. 2c) due to the difference between the oxidizing amounts of the drain region 2 and the hetero semiconductor region 3. The driving point 6 (where the hetero semiconductor region 3, the drain region 2 and the gate insulating film are adjoined) is formed by dry etching and located apart from the side wall of the trench.

Alternatively, after performing the dry etching process shown in FIG. 2c, the exposed portion may be removed through wet etching, which sets a certain selection ratio between polycristal silicon and SiC. By doing so, the configuration of FIG. 1 can be obtained (i.e., the driving point 6 is spaced apart from the side wall of the trench). In another embodiment, it is possible to achieve this configuration by forming a resist material for the mask material used in the process shown in FIG. 2c. Then, the same wet etching can be performed after conducting a reduction process on the resist material through baking or UV irradiating.

As such, the trench may suffer from etching damage throughout a certain depth thereof depending on the condition of dry etching when forming the trench. However, the driving point 6 at the edge portion of the junction end of the drain region 2 and the hetero semiconductor region 3 is located apart from the side wall of the trench where the etching damage does not occur. Therefore, it is possible to form the driving point 6 at a location not affected by the etching damage.

Figure 2E:
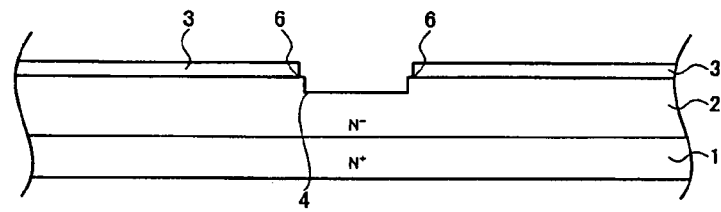

Further, a distance between the driving point 6 and the side wall of the trench may be adjustable by controlling the oxidization amount in the process shown in FIG. 2d. Therefore, the distance can be set to be equal to or more than the range affected by the etching damage as shown in FIG. 2e.

Figure 2F:
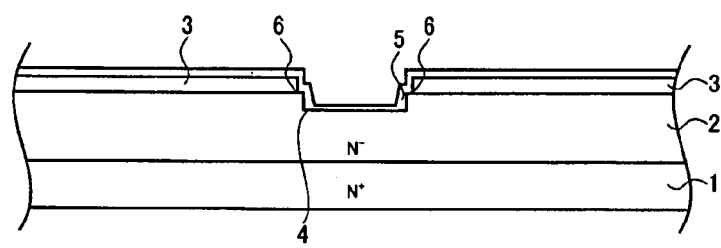

Next, the gate insulating film 5 is deposited on an entire surface of the device by using a deposition method such as CVD (Chemical Vapor Deposition) as shown in FIG. 2f. A suitable annealing treatment is performed on the gate insulating film 5.

Figure 2G:
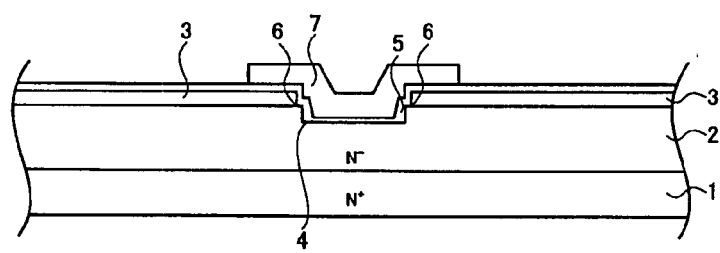

Next, a polycrystal silicon corresponding to a gate electrode 7 is deposited on the gate insulating film 5. Then impurities are introduced from a surface of the gate electrode 7 to pattern a desired configuration. This is shown in FIG. 2g.

Figure 2H:
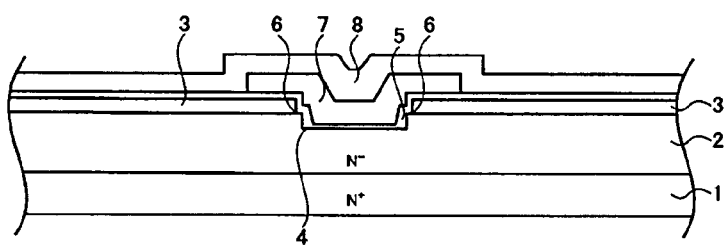

As shown in FIG. 2h, an interlayer insulating film 8 is next deposited on an entire surface of the device.

Figure 2I:
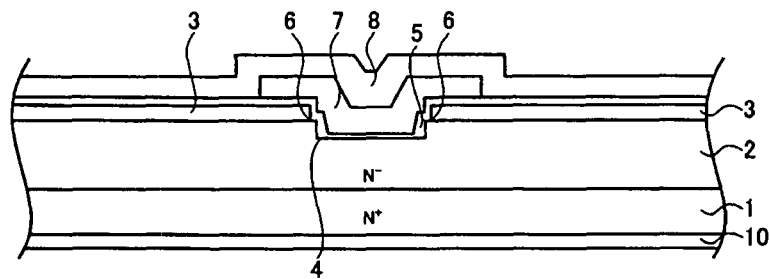

Subsequently, after removing the polycrystal silicon attached to the underside of the device, the drain electrode 10 is formed of metal and is adjoined to the substrate region 1. Thereafter, a thermal treatment is performed thereon such that the drain electrode 10 and the substrate region 1 are alloyed to ohmically connect to each other at a low resistance as shown in FIG. 2i.

Figure 2J:
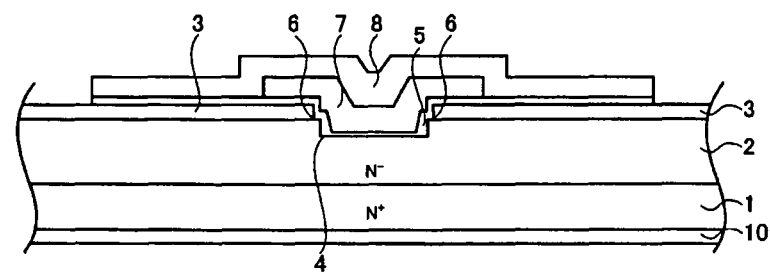

In FIG. 2j, the interlayer insulating film 8 is patterned to a desired configuration as shown.

Figure 2K:
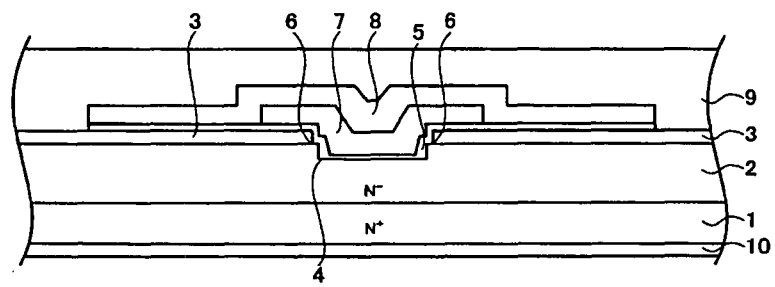

Finally, as shown in FIG. 2k, a contact hole is formed, and the source electrode 9 is formed of metal to be adjoined with the hetero semiconductor region 3 via the contact hole, thereby obtaining the device shown in FIG. 1.

The basic operation of a transistor, which is manufactured in accordance with the above, is the same as that of the conventional transistor. Hereinafter, the effects that can be achieved by the first embodiment are explained.

First, as described above, the driving point 6 of the transistor is formed at a location spaced apart from the side wall of the trench. Therefore, the driving point is not subject to the effect of etching damage occurring at the side wall of the trench by dry etching. Therefore, an interface level around the driving point 6 is small and a grain thereof is maintained in an ideal state. When the device is in a conduction state, an electrical field from the gate electrode 7 is effectively applied to the driving point 6. At the same time, the interface mobility around the driving point 6 is increased. Accordingly, the driving power is improved, and the impedance can be sufficiently reduced.

Further, according to the first embodiment, the gate electrode 7 is formed in the trench, which is formed in the inner portion of the drain region 2. Accordingly, when the device is in a non-conduction state, the voltage of the gate electrode 7 positioned at a certain depth in the drain region 2 is fixed to 0V. Further, it is possible to shield an electrical field formed by high voltage applied to the drain electrode 10 at a deeper position. Therefore, the effect of lessening an electrical field around the driving point 6 is increased such that a leak current can be reduced when the device is in an off state.

This could greatly contribute to miniaturization, scaling down and cost reduction of a power electronic system including a vehicle-mounting power electronic system.

Figure 3:
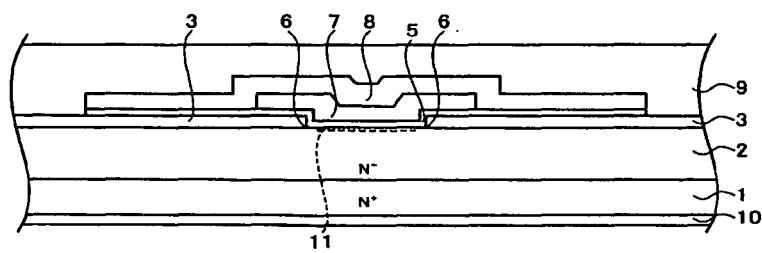
FIG. 3 is a cross-sectional view of a semiconductor device constructed in accordance with a second embodiment of the invention.

FIG. 3 illustrates the configuration of a semiconductor device constructed in accordance with a second embodiment of the invention. In the first embodiment shown in FIG. 1, the trench is formed in the inner portion of the drain region 2 as shown in FIG. 2c. The second embodiment shown in FIG. 3 has a configuration similar to the first embodiment except that a bottom portion 11 of the trench (a bottom portion of a dry etching surface) made by dry etching is positioned at a junction interface of the hetero semiconductor region 3 and the drain region 2.

By adopting such a configuration, the oxide film is formed and removed after forming the trench in the same manner as in the first embodiment such that the driving point 6 of the transistor is formed and located apart from the side wall of the trench, which is formed through etching. Thus, the driving point is not subject to the effect of etching damage occurring when forming the trench. Therefore, the second embodiment can achieve the same effect as the first embodiment.

Figure 4:
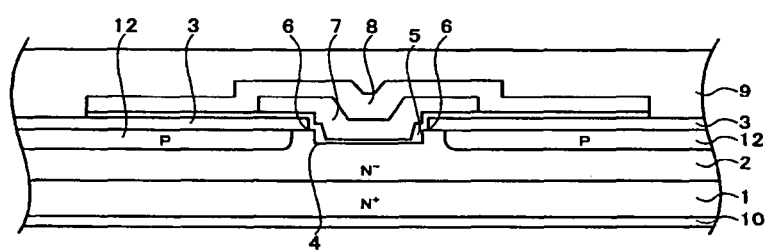
FIG. 4 is a cross-sectional view of a semiconductor device constructed in accordance with a third embodiment of the invention.

FIG. 4 illustrates the configuration of a semiconductor device constructed in accordance with a third embodiment of the invention. The third embodiment shown in FIG. 4 has a configuration similar to the first embodiment except that a P-type well region 12 is formed on an upper surface portion of the drain region 2 to be adjoined with the hetero semiconductor region 3. The P-type well region 12 functions as an electrical field relaxing layer when the device is in a non-conduction state.

By adopting such a constitution including the electrical field relaxing layer, the effect of reducing a leak current when the element is non-conducted can be obtained in addition to the effects achieved by the first embodiment. Further, a device having a high pressure-resistance can be obtained with low impedance.

Figure 5:
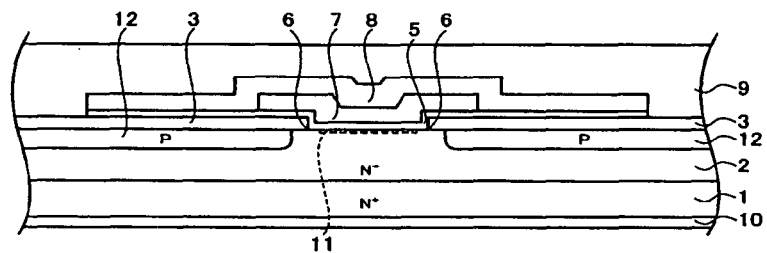
FIG. 5 is a cross-sectional view of a semiconductor device constructed in accordance with a fourth embodiment of the invention.

FIG. 5 illustrates the configuration of a semiconductor device constructed in accordance with a fourth embodiment of the invention. The fourth embodiment shown in FIG. 5 has a configuration similar to the second embodiment except that a P-type well region 12 is formed on an upper surface portion of the drain region 2 to be adjoined with the hetero semiconductor region 3. The P-type well region 12 functions as an electrical field relaxing layer when the device is in a non-conduction state.

By adopting such a constitution including the electrical field relaxing layer, the effect of reducing a leak current when the device is in a non-conduction state can be obtained in addition to the effects achieved by the second embodiment. Further, a device having a high pressure-resistance can be obtained with low impedance.

Figure 6:
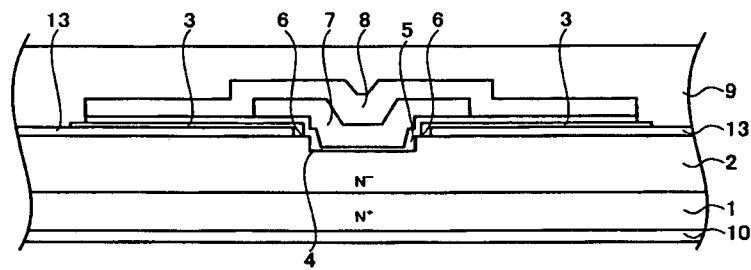
FIG. 6 is a cross-sectional view of a semiconductor device constructed in accordance with a fifth embodiment of the invention.

FIG. 6 illustrates the configuration of a semiconductor device constructed in accordance with a fifth embodiment of the invention. The fifth embodiment shown in FIG. 6 has a configuration similar to the first embodiment except that a $P^+$-type hetero semiconductor region 13 is formed under the hetero semiconductor region 3.

By adopting such a constitution, it is possible to form a barrier of the heterojunction interface to be higher by the $P^+$-type hetero semiconductor region 13. Further, in addition to the effects achieved by the first embodiment, a device having a higher pressure-resistance can be obtained.

Figure 7:
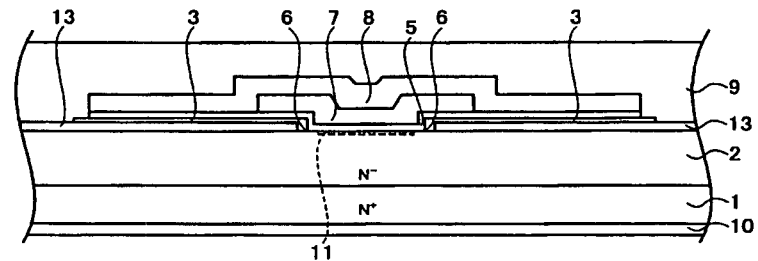
FIG. 7 is a cross-sectional view of a semiconductor device constructed in accordance with a sixth embodiment of the invention.

FIG. 7 illustrates the configuration of a semiconductor device constructed in accordance with a sixth embodiment of the invention. The sixth embodiment shown in FIG. 7 has a configuration similar to the second embodiment except that a $P^+$-type hetero semiconductor region 13 is formed under the hetero semiconductor region 3.

By adopting such a constitution, it is possible to form a barrier of the heterojunction interface to be higher by the $P^+$-type hetero semiconductor region 13. Further, in addition to the effects achieved by the second embodiment, a device having a higher pressure-resistance can be obtained.

Also, in the first to sixth embodiments previously mentioned as well as the seventh to ninth embodiments explained below, the semiconductor substrate may contain gallium nitride or diamond in addition to silicon carbide. Further, in addition to polycrystal silicon, the hetero semiconductor region may include any one of single crystal silicon, amorphous silicon, single crystal silicon germanium, polycrystal silicon germanium and amorphous silicon germanium.

Figure 8A:
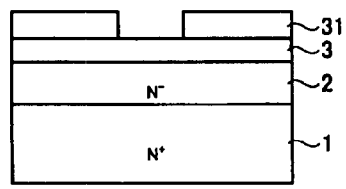
FIGS. 8a to 8f are cross-sectional views for illustrating a method of manufacturing a semiconductor device constructed in accordance with a seventh embodiment of the invention.

FIGS. 8a to 8f are cross-sectional views illustrating a method of manufacturing a semiconductor device constructed in accordance with a seventh embodiment of the invention. The seventh embodiment is another embodiment of the method for manufacturing the semiconductor device shown in FIG. 1. First, a drain region 2 containing $N^-$-type SiC is formed on the substrate region 1 of $N^+$-type SiC through an epitaxial growing process. Then, a polycrystal silicon is deposited on the drain region 2 as a hetero semiconductor region 3, thereby forming a heterojunction between the drain region 2 and the hetero semiconductor region 3. In such a case, a post-annealing may be performed in order to obtain a desired heterojunction characteristic by controlling the particle size or the grain boundary condition of the polycrystal silicon. Subsequently, impurities are introduced into the hetero semiconductor region 3 of a polycrystal silicon by using, for example, a mechanism such as ion injection so that the hetero semiconductor region 3 becomes $N^+$-type. Examples of the impurities include As (arsenic), P (phosphorous) and the like. Then, a resist 31 corresponding to a mask material is applied on the hetero semiconductor region 3. This structure is shown in FIG. 8a.

Figure 8B:
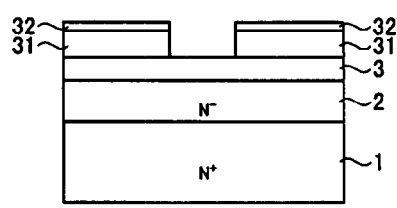

Next, a photomask 32 is formed on the resist 31 as shown in FIG. 8b. The resist 31 is selectively removed and patterned through etching using the photomask 32.

Figure 8C:
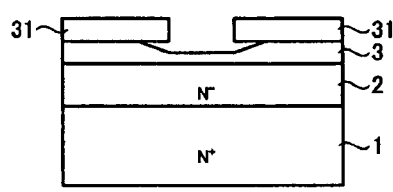

After the photomask 32 is removed, the hetero semiconductor region 3 of a polycrystal silicon is selectively removed through wet etching (i.e., isotropic etching) using the patterned resist 31 as a mask as shown in FIG. 8c. Alternatively, chemical dry etching may be used in this embodiment so long as it is an isotropic etching.

Figure 9A:
FIGS. 9a to 9b are cross-sectional views for illustrating the characteristics of an isotropic etching.
Figure 9B:
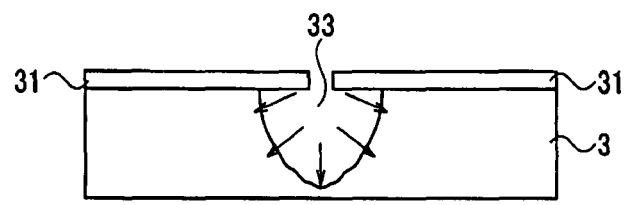

The characteristic of isotropic etching are explained below with reference to FIGS. 9a to 9b. As shown in FIG. 9a, when a fine pattern such as a narrow vertical trench 33 is to be formed on the hetero semiconductor region 3 by selectively etching the hetero semiconductor region via the patterned resist 31, a portion of the hetero semiconductor region 3 under the resist 31 may be etched. Accordingly, the hetero semiconductor region 3 may be laterally etched. As a result, as shown in FIG. 9b, the wall surface of the trench 33 may be etched so as to have a curved surface.

Referring back to FIG. 8c, as explained with reference to FIGS. 9a to 9b, in such an isotropic etching process, the etching of the hetero semiconductor region 3 is advanced to a portion under the resist 31. Further, the thickness of the thinnest portion of the hetero semiconductor region 3 remaining after etching becomes about hundreds of angstroms (Å). Further, although the etching surface of the hetero semiconductor region 3 is shown in a taper form in FIG. 8c for ease of explanation, the etching surface of the hetero semiconductor region 3 typically has a curved etching shape as shown in FIG. 9b.

Figure 8D:
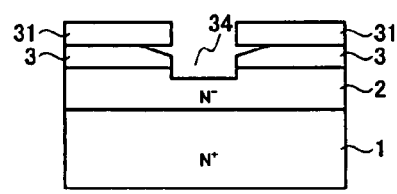
Figure 8E:
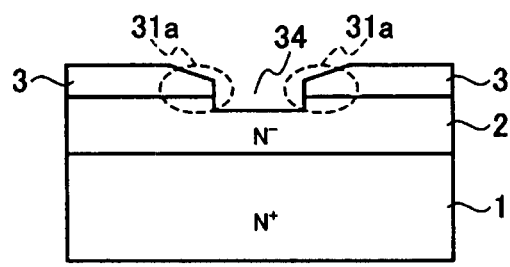

Next, the hetero semiconductor region 3 and the drain region 2 are selectively removed through dry etching (i.e., anisotropic etching) by using the resist 31 as a mask. As such, a trench 34 is formed and a bottom portion thereof extends to the drain region 2 as shown in FIG. 8d.

Thereafter, a hetero semiconductor region 31a, the thickness of which becomes gradually thinner, is obtained around the trench 34 by removing the resist 31. For example, the thickness is about hundreds of Å. Further, the length of the hetero semiconductor region 31a, the thickness of which becomes gradually thinner, is about thousands of Å in the lateral direction from an end portion of the trench 34.

Figure 8F:
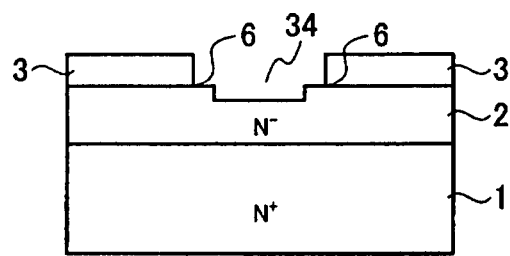

Subsequently, a polycrystal silicon (i.e., hetero semiconductor region 3) and an exposed portion of the drain region 2 are thermally oxidized to form a sacrificial oxide film. In such a case a bottom portion of the drain region 2 of SiC is also oxidized. Since the oxidation ratio of SiC is smaller than that of a polycrystal silicon, however, the oxidation amount of the drain region 2 of SiC becomes smaller than that of the hetero semiconductor region 3 of a polycrystal silicon. The sacrificial oxide films are then removed by fluoric acid based wet etching. Accordingly, the hetero semiconductor region 31a, the thickness of which becomes thinner, is removed such that an end portion of the hetero semiconductor region 3 is receded from a side wall of the trench 34. The driving point 6 (where the hetero semiconductor region 3, the drain region 2 and the gate insulating film 5 are adjoined) is formed by dry etching and located apart from the side wall of the trench 34 as shown in FIG. 8f.

Thereafter, such a semiconductor device shown in FIG. 1 is obtained through the processes illustrated in FIGS. 2f to 2k, which are provided in relation to the first embodiment.

Also in accordance with the seventh embodiment, a semiconductor device that has the characteristics of the first embodiment can be easily manufactured. Further, by employing the above manufacturing method, it is possible to lightly perform a sacrificial oxidation on the hetero semiconductor region 3 in a longitudinal direction when forming the driving point 6 in a position spaced apart from the etching surface by about thousands of Å. Therefore, the amount of the sacrificial oxidization can be restrained, and a load of the manufacturing process can be reduced. Furthermore, the adverse effect caused by heavy sacrificial oxidization can be reduced.

Figure 10A:
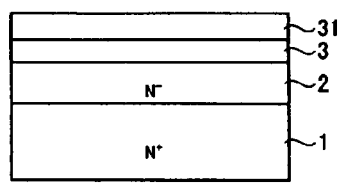
FIGS. 10a to 10d are cross-sectional views for illustrating a method of manufacturing a semiconductor device constructed in accordance with an eighth embodiment of the invention.

FIGS. 10a to 10d are cross-sectional views illustrating a method of manufacturing a semiconductor device constructed in accordance with an eighth embodiment of the invention. The eighth embodiment is another embodiment of the method for manufacturing such a semiconductor device as that shown in FIG. 1. First, a drain region 2 of $N^-$-type SiC is formed on a substrate region 1 of $N^+$-type SiC through an epitaxial growing process. Then, a polycrystal silicon is deposited on the drain region 2 as a hetero semiconductor region 3, thereby forming a heterojunction between the drain region 2 and the hetero semiconductor region 3. In such a case, post-annealing may be performed in order to obtain a desired heterojunction characteristic by controlling the particle size or the grain boundary condition of the polycrystal silicon. Subsequently, impurities are introduced into the hetero semiconductor region 3 of a polycrystal silicon by using, for example, a mechanism such as ion injecting so that the hetero semiconductor region 3 becomes $N^+$-type. Examples of the impurities include As (arsenic), P (phosphorous) and the like. Then, a resist 31 corresponding to a mask material is applied on the hetero semiconductor region 3. This structure is shown in FIG. 10a.

Figure 10B:
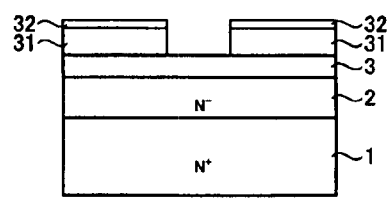

A photomask 32 is next formed on the resist 31. The resist 31 is selectively removed and patterned through etching by using the photomask 32 as shown in FIG. 10b.

Figure 10C:
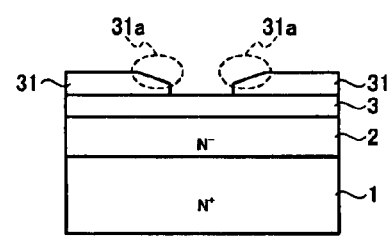

The resist 31 is then removed by isotropic wet etching. Accordingly, the edge portion of an upper end of the resist 31 is isotropically etched and removed, thereby obtaining an edge portion 31a in a taper form as shown in FIG. 10c.

Figure 10D:
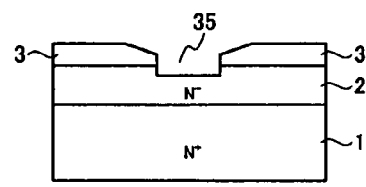

Next, dry etching (i.e., anisotropic etching) is performed to selectively remove the hetero semiconductor region 3 and the drain region 2 by using the resist 31, the edge portion 31a of which has a taper form, as a mask. As such, a trench 35 is formed such that a bottom portion thereof extends to the drain region 2. In such a case, each edge portion 31a of the resist 31 having a taper form is more rapidly etched than the other portions of the resist 31 through anisotropic etching. Thus, the underlying hetero semiconductor region 3 is etched. As a result, a portion of the hetero semiconductor region 3, the thickness of which becomes gradually thinner, is formed around the trench 35 as shown in FIG. 10d. That is, the shape of the resist 31 is transferred into the hetero semiconductor region 3. The thickness of the thinner portion of the hetero semiconductor region 3 is about thousands of Å. Further, a length of the hetero semiconductor region 3, the thickness of which becomes thinner, is about thousands of Å in the lateral direction from an end of the trench 35.

Thereafter, the semiconductor device shown in FIG. 1 is obtained through the processes shown in FIGS. 2f to 2k and FIGS. 8e and 8f, which have been explained above in relation to the first and seventh embodiments.

Also in accordance with the eighth embodiment, a semiconductor device, which has the characteristics of the first embodiment, can be easily manufactured. Further, the resist 31 on an uppermost surface is processed by employing the above-described method. As such, the manufacturing process proceeds while monitoring the shape of a device produced during the manufacturing process.

Figure 11A:
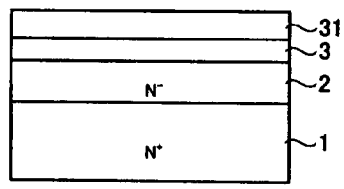
FIGS. 11a to 11d are cross-sectional views for illustrating a method of manufacturing a semiconductor device constructed in accordance with a ninth embodiment of the invention.

FIGS. 11a to 11d are cross-sectional views illustrating a method of manufacturing a semiconductor device constructed in accordance with a ninth embodiment of the invention. The ninth embodiment is another embodiment of a method for manufacturing a semiconductor device as shown in FIG. 1. First, the drain region 2 of N⁻-type SiC is formed on the substrate region 1 of N⁺-type SiC through an epitaxial growing process. Then, a polycrystal silicon is deposited on the drain region 2 as a hetero semiconductor region 3, thereby forming a heterojunction between the polycrystal silicon and the drain region 2. In such a case post-annealing may be performed in order to obtain a desired heterojunction characteristic by controlling the particle size or the grain boundary condition of the polycrystal silicon. Subsequently, impurities are introduced into the hetero semiconductor region 3 of a polycrystal silicon by using, for example, a mechanism such as ion injection. This is done so that the hetero semiconductor region 3 becomes N⁺-type. Examples of the impurities include As (arsenic), P (phosphorous) and the like. Then, a resist 31 corresponding to a mask material is applied on the hetero semiconductor region 3. The resulting structure is shown in FIG. 11a.

Figure 11B:
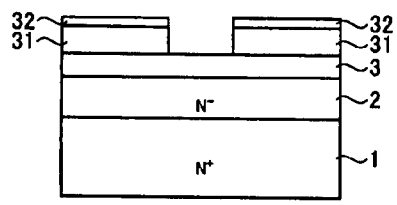

A photomask 32 is next formed on the resist 31. The resist 31 is selectively removed and patterned through etching by using the photomask 32 as shown in FIG. 11b.

Figure 11C:
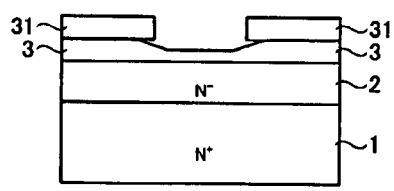

Then, after the photomask 32 is removed, the hetero semiconductor region 3 of a polycrystal silicon is selectively removed through wet etching (i.e., isotropic etching) by using the patterned resist 31 as a mask as shown in FIG. 11c. Alternatively, chemical dry etching may be used in this embodiment so long as it is an isotropic etching. In the isotropic etching process, a portion of the hetero semiconductor region 3 under the resist 31 may be etched in a similar manner as explained with reference to FIGS. 9a to 9b. Further, the thickness of the thinnest portion of the etched hetero semiconductor region 2 becomes hundreds of Å. Although the etching surface of the hetero semiconductor region 3 is shown to have a tapered shape in FIG. 11c for ease of explanation, the etching surface of the hetero semiconductor 3 typically has a curved shape as shown in FIG. 9b.

Figure 11D:
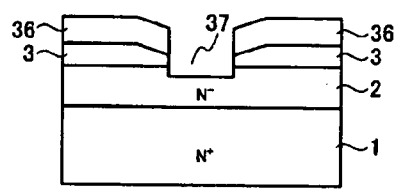

After the resist 31 is removed, a resist 36 is additionally applied on the hetero semiconductor region 3. The resist 36 is then selectively removed and patterned. Thereafter, the hetero semiconductor region 3 and the drain region 2 are selectively removed through dry etching (i.e., anisotropic etching) by using the patterned resist 36 as a mask. Accordingly, a trench 37 is formed such that a bottom portion thereof extends to the drain region 2 as shown in FIG. 11d.

Thereafter, the semiconductor device shown in FIG. 1 is obtained through the processes shown in FIGS. 2f to 2k and FIGS. 8e and 8f, which have already been explained in relation to the first and seventh embodiments.

According to the ninth embodiment, a semiconductor device, which has the characteristics of the first embodiment, can be easily manufactured. Further, by employing the above method, it is possible to form a device without being affected by the recession of a resist in the etching process.

Further, in the seventh to ninth embodiments, an oxide film may be used as a mask material instead of a resist.

Also, the above-described embodiments have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A semiconductor device, comprising:
   a semiconductor substrate of a first conductive-type;
   a hetero semiconductor region adjoined to a main surface of the semiconductor substrate;
   a trench formed in the semiconductor substrate and the hetero semiconductor region, the trench having a first width in the semiconductor substrate and a second width in the hetero semiconductor region wherein the second width is wider than the first width such that the main surface of the semiconductor substrate is exposed on each side of the trench as a transition portion between the first width and the second width, the hetero semiconductor region forming a heterojunction with the semiconductor substrate;
   a gate electrode disposed in the trench using a gate insulating film;
   a source electrode connected to the hetero semiconductor region;
   a drain electrode connected to the semiconductor substrate; and
   a driving point of the semiconductor substrate where the gate insulating film, the hetero semiconductor region and the transition portion of the semiconductor substrate are adjoined on each side of the trench.

2. The semiconductor device according to claim 1 wherein the hetero semiconductor region around the driving point is of the first conductive-type.

3. The semiconductor device according to claim 1 wherein the semiconductor substrate comprises at least one of a silicon carbide, a gallium nitride and a diamond.

4. The semiconductor device according to claim 1 wherein the hetero semiconductor region comprises at least one of a single crystal silicon, a polycrystal silicon, an amorphous silicon, a single silicon germanium, a polycrystal silicon germanium and an amorphous silicon germanium.

5. The semiconductor device according to claim 1 wherein the hetero semiconductor region around proximate the trench has a thickness smaller than a thickness of other portions of the hetero semiconductor region.

6. The semiconductor device according to claim 2 wherein the semiconductor substrate comprises at least one of a silicon carbide, a gallium nitride and a diamond.

7. The semiconductor device according to claim 3 wherein the hetero semiconductor region comprises at least one of a single crystal silicon, a polycrystal silicon, an amorphous silicon, a single silicon germanium, a polycrystal silicon germanium and an amorphous silicon germanium.

* * * * *